United States Patent
Urankar et al.

(10) Patent No.: US 11,322,297 B2
(45) Date of Patent: May 3, 2022

(54) ELECTRIC CURRENT TRANSFORMER AND CURRENT MEASUREMENT UNIT

(71) Applicant: Schneider Electric Industries SAS, Rueil Malmaison (FR)

(72) Inventors: Lionel Urankar, Fontaine (FR);
Jean-Yves Amblard, Le Gua (FR);
Bertrand Du Peloux De Saint Romain, Theys (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 364 days.

(21) Appl. No.: 16/519,196

(22) Filed: Jul. 23, 2019

(65) Prior Publication Data

US 2020/0105463 A1 Apr. 2, 2020

(30) Foreign Application Priority Data

Sep. 27, 2018 (FR) ...................... 18 58838

(51) Int. Cl.
| | | |
|---|---|---|
| H01F 27/28 | (2006.01) | |
| H01F 27/30 | (2006.01) | |
| G01R 15/18 | (2006.01) | |
| H01F 38/38 | (2006.01) | |

(52) U.S. Cl.
CPC ......... *H01F 27/306* (2013.01); *G01R 15/183* (2013.01); *H01F 27/2804* (2013.01); *H01F 38/38* (2013.01)

(58) Field of Classification Search
CPC .. H01F 27/2804; H01F 5/003; H01F 17/0006; H01F 27/306; H01F 38/38; H01F 27/427; H01F 38/28; H01F 38/34; G01R 15/183

USPC .................................................. 336/173–175
See application file for complete search history.

(56) References Cited

U.S. PATENT DOCUMENTS

| | | | |
|---|---|---|---|
| 7,106,162 B2* | 9/2006 | Saito | H01F 5/003 336/229 |
| 7,579,824 B2* | 8/2009 | Rea | G01R 15/181 324/117 R |
| 8,710,824 B2* | 4/2014 | Ibuki | G01R 15/142 324/126 |
| 2010/0301836 A1 | 12/2010 | Kern | |
| 2017/0146572 A1* | 5/2017 | Urankar | G01R 21/00 |
| 2018/0052191 A1* | 2/2018 | Kern | G01R 15/181 |

FOREIGN PATENT DOCUMENTS

| | | | |
|---|---|---|---|
| FR | 2 701 591 A1 | 8/1994 | |
| FR | 2 920 881 B1 | 3/2010 | |
| FR | 2920881 B1 * | 3/2010 | ........... G01R 15/181 |

* cited by examiner

Primary Examiner — Tszfung J Chan
(74) Attorney, Agent, or Firm — Oblon, McClelland, Maier & Neustadt, L.L.P.

(57) ABSTRACT

An electric current transformer including a first coil and a second coil, which are produced with a first printed circuit including a first positioning device, and a second positioning device; and a first magnetic part including a first holding device and a second magnetic part including a second holding device, the positioning device being arranged to join together with the holding device so as to hold reference faces of the magnetic parts a predetermined distance away from the turns of the first and second coils. A current measurement unit includes such a current transformer.

17 Claims, 8 Drawing Sheets

ELECTRIC CURRENT TRANSFORMER AND CURRENT MEASUREMENT UNIT

TECHNICAL FIELD

The present invention relates to a current transformer intended to measure an electric current flowing through a current conductor. It is more particularly applicable to the measurement of alternating currents, in an industrial setting.

The invention also relates to a unit for measuring the magnitude of an electric current or for measuring power or electric energy.

PRIOR ART

A current transformer is frequently used, in a unit for measuring current, power or electric energy, to deliver a signal representative of an electric current to be measured in an electric installation. Current transformers have the advantage of providing a galvanic isolation between a current line through which the current to be measured flows and the one or more circuits for measuring the signal delivered by the current transformer. This advantage is useful for the measurement of current in an electric installation of 400 V voltage, for example. The design of such current transformers is simple and tried and tested but new constraints, related in particular to the desire to control power consumption, are appearing:
  the current transformer must deliver a signal of sufficient amplitude, and the precision of which is high for a wide range of amplitudes of the current to be measured,
  the transformer must be insensitive to cross talk and to external electromagnetic fields,
  the transformer must be compact in order to be integrated into a measurement unit of small volume or to be installed on a bus bar the spacing between the current conductors of which is standardized, and, for example, 18, 25 or 27 mm,
  the cost price of the transformer must be low in order to limit the expense created by multiplication of measurement points in the electric installation, and
  the current transformer must be able to be mass manufactured industrially while guaranteeing the desired measurement precision is obtained without the need for calibration.

A current transformer including a coil wound around a magnetic circuit delivers a precise signal in a range of variations to be measured excluding very low currents and very high currents. A Rogowski transformer, since it does not include a magnetic circuit, has a very high dynamic measurement range but a lower signal level. In order to reconcile all of the constraints, one compromise consists in constructing a current transformer including one or more magnetic cores including one or more gaps in which measurement windings are placed. For example, patent application FR 2 891 946 A1 describes an open measurement device, including a coil wound around an a magnetic armature and placed in the gap of a "U"-shaped magnetic yoke. Patent application FR 2 977 323 A1 describes a measurement device including a magnetic core formed from two parts of "I" shape forming, at their end, two gaps in which are placed two secondary measurement coils.

The use of a printed circuit to produce measurement coils is described in patent application WO 01/57 543 A1 a first variant of a Rogowski current sensor includes two circular coils, each coil being placed on one printed circuit board. Another variant shows a sensor of rectangular shape the sides of which are formed by rectilinear coils and the corners of which are formed from magnetic shielding parts. Patent FR 2 920 881 B1 describes a device for measuring the magnitude of an electric current including an open magnetic circuit that bounds by a large gap in which an electric coil is housed, the gap having a width at least twice as large as the cross section of the magnetic circuit.

The solutions proposed in the prior-art documents allow electric currents to be measured with an excellent precision when the sensor has a circular shape. However, said solutions are unable to satisfactorily measure electric currents with a precision higher than 0.5% when the sensors have a polygonal shape suitable for being placed in an item of three-phase equipment. Specifically, each sensor is influenced by the magnetic field generated by the currents flowing through the adjacent phases and the geometric discontinuities introduced by the corners accentuate this negative influence. The present invention therefore aims to remedy these drawbacks.

SUMMARY OF THE INVENTION

To this end, the invention relates to a current transformer including:
  a first coil and a second coil, which are produced by means of a first printed circuit of substantially parallelepipedal shape, including a first upper face, a first lower face, a first side, a second side, the second side being opposite to the first side, a third side and a fourth side, the fourth side being opposite to the third side, the first coil being formed from first turns that are coiled about a first coil axis that is substantially perpendicular to the third and fourth sides, the second coil being formed from second turns that are coiled about a second coil axis that is substantially perpendicular to the third and fourth sides, the first printed circuit including a first aperture in the first upper and lower faces in order to form a through-passage for a current line, said current line forming a primary circuit of the current transformer, the first coil and the second coil being placed on either side of the first aperture and forming a secondary circuit, and
  a first magnetic part of elongate shape including a first reference face and at least one second magnetic part of elongate shape including a second reference face,
  the current transformer being such that:
  the first printed circuit including a first positioning means, placed in proximity to the third side, and a second positioning means placed in proximity to the fourth side,
  the first magnetic part comprising a first holding means,
  the second magnetic part comprising a second holding means, the first positioning means is arranged to join together with the first holding means in order to hold the first reference face at a predetermined distance with respect to the third side, and the second positioning means is arranged to join together with the second holding means in order to hold the second reference face at a predetermined distance with respect to the fifth side.
  Advantageously:
  the first positioning means and the second positioning means are holes drilled in the first printed circuit,
  the first holding means is a peg arranged to be inserted into the first positioning means, and
  the second holding means is a peg arranged to be inserted into the second positioning means.

Preferably:
the first positioning means is placed in a first protuberance formed in the third side of the first printed circuit,
the second positioning means is placed in a second protuberance formed in the fourth side of said first printed circuit,
the first holding means is formed by a cutout of the first magnetic part, and
the second holding means is formed by a cutout of the second magnetic part.

Advantageously, the first coil and the second coil are formed of turns coiled with a constant coil pitch.

Preferably, the coil pitch is comprised between 50 and 700 microns.

Advantageously, the first reference face and the second reference face protrude from the first upper face and the first lower face by a distance larger than a coil pitch.

Advantageously, each turn being produced in the thickness of the first printed circuit and including a first conductive segment on the first upper face of the first printed circuit and a second conductive segment on the first lower face of said first printed circuit, the first conductive segments of the turns of the first coil are symmetric, with respect to the centre of the first aperture, with the first conductive segments of the turns of the second coil and the second conductive segments of the turns of the first coil are symmetric, with respect to the centre of the first aperture, with the second conductive segments of the turns of the second coil.

Preferably, the first coil comprising a first lateral turn at a first end facing the first reference face, and a second lateral turn at a second end facing the second reference face, and the second coil including a third lateral turn at a third end facing the first reference face, and a fourth lateral turn at a fourth end facing the second reference face, the first coil and the second coil are placed on the first printed circuit in such a way that:
the distance between the first lateral turn of the first coil and the first reference face is substantially equal to half the coil pitch,
the distance between the first lateral turn of the second coil and the first reference face is substantially equal to half the coil pitch,
the distance between the second lateral turn of the first coil and the second reference face is substantially equal to half the coil pitch, and
the distance between the second lateral turn of the second coil and the second reference face is substantially equal to half the coil pitch.

Advantageously, the ends of at least one of the first or second segments of the first lateral turn and of the second lateral turn of the first coil and of the second coil, respectively, are curved to form a C the ends of which extend away from the first reference face and from the second reference face, respectively.

Preferably, the first and second coil are electrically connected in series, the first lateral turn of the first coil being connected to the first lateral turn of the second coil and the second lateral turn of the first coil being connected to the second lateral turn of the second coil.

Advantageously, the first coil is composed of:
a first half-coil comprising a first electric connection point, and
a second half-coil comprising a second electric connection point,
the first and second connection points being located substantially in the middle of the first side.

Preferably, the transformer comprises a third coil and a fourth coil that are produced by means of a second printed circuit of substantially parallelepipedal shape, including a second upper face, a second lower face, a fifth side, a sixth side, the sixth side being opposite to the fifth side, a seventh side and an eighth side, the eighth side being opposite to the seventh side, the third and fourth coils being coiled about axes parallel to the first and second coil axes, respectively, the second printed circuit comprising a second aperture in the two second faces in order to form a through-passage for the electrical conductor, the third coil and the fourth coil being placed on either side of the second aperture.

Advantageously, the second printed circuit includes:
a third positioning means arranged to join together with the first holding means in order to hold the first reference face a predetermined distance away from the seventh side, and
a fourth positioning means arranged to join together with the second holding means in order to hold the second reference face a predetermined distance away from the eighth side.

Preferably, the third coil and the fourth coil being formed from turns produced in the thickness of the second printed circuit:
the third coil is coiled in the opposite direction to the coiling direction of the first coil, and
the fourth coil is coiled in the opposite direction to the coiling direction of the second coil.

Preferably, the third coil includes:
a third half-coil comprising a third electric connection point, and
a fourth half-coil comprising a fourth electric connection point,
the third electric connection point and the fourth electric connection point being located substantially in the middle of the fifth side.

Preferably, the first printed circuit or the second printed circuit comprises a third protuberance for the placement of:
one or more measurement circuits for processing signals delivered by the first, second, third and fourth coils and delivering a measurement signal representative of the current flowing through the current line,
electric connections for transmitting the measurement signal to a measurement unit.

Another subject of the invention is a unit for measuring the current flowing through a current line of an electric installation, said unit including:
a current transformer such as described above, including a first aperture and a second aperture, through which apertures passes a current line, said current transformer delivering:
a first measurement signal representative of the current flowing through the current line passing through the first aperture, and
a second measurement signal representative of the current flowing through the current line passing through the second aperture of the current measurement device, and
a measurement circuit, connected to the current transformer in order to receive the first measurement signal and the second measurement signal, said measurement circuit delivering a measurement of the amplitude of the current flowing through the current line, said measurement being issued from a measurement of the first measurement signal and of the second measurement signal, an interface circuit connected to the measurement circuit in order to display the measurement of the measurement signal or transmit said measurement, and a supply circuit for supplying the measurement circuit and the interface circuit with power.

BRIEF DESCRIPTION OF THE DRAWINGS

Other advantages and features will become more clearly apparent from the following description of particular embodiments of the invention, which are given by way of nonlimiting example, and shown in the appended drawings, in which.

DETAILED DESCRIPTION OF PREFERRED EMBODIMENTS

Figure 1:
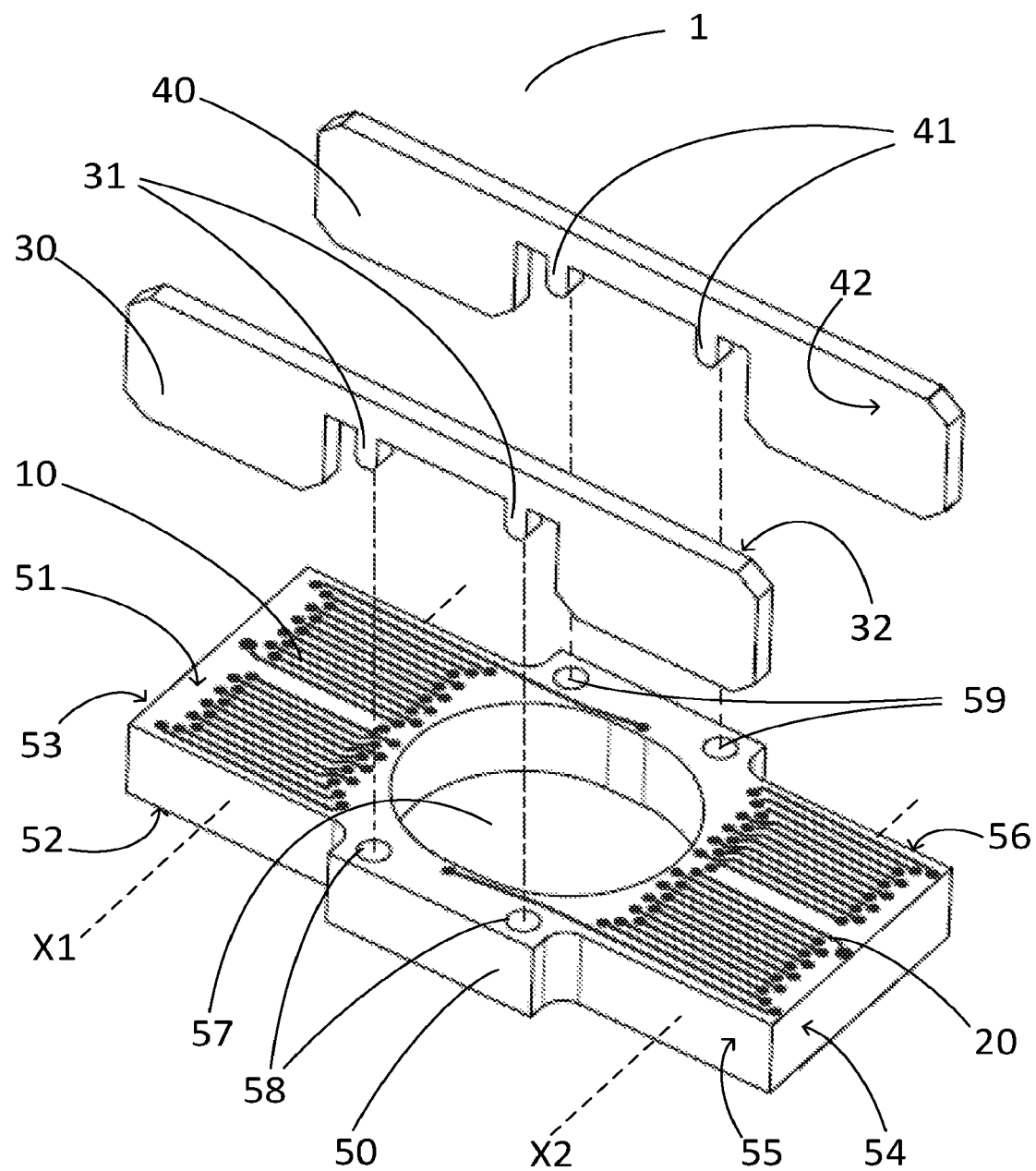
FIG. 1 is an exploded view of a first embodiment of a current transformer according to the invention.

FIG. 1 is an exploded view of a first embodiment of a current transformer 1 according to the invention. Said current transformer 1 includes a first coil 10 and a second coil 20, which are produced by means of a first printed circuit 50 of substantially parallelepipedal shape. Said first printed circuit 50 includes a first upper face 51, a first lower face 52, a first side 53, a second side 54, the second side 54 being opposite to the first side 53 in the parallelepiped formed by the printed circuit 50, a third side 55 and a fourth side 56, the fourth side 56 being opposite to the third side 55. The first coil 10 is formed from first turns that are formed in the thickness of the first printed circuit 50 and that are coiled about a first coil axis X1 that is substantially perpendicular to the third and fourth sides 55, 56. The second coil 20 is formed from second turns that are coiled about a second coil axis X2 that is substantially perpendicular to the third and fourth sides 55, 56. The first printed circuit 50 includes a first aperture 57 in the two faces 51, 52 in order to form a through-passage for a current line 2, said current line forming a primary circuit of the current transformer 1. The first coil and the second coil 10, 20 are placed on either side of the first aperture 57 and form a secondary circuit of the current transformer 1.

The current transformer 1 also includes a first magnetic part 30 of elongate shape including a first reference face 32 and at least one second magnetic part 40 of elongate shape including a second reference face 42. To rationalize industrial production of the current transformer 1, the first and second magnetic parts 30, 40 are preferably identical. The material of the magnetic parts is preferably composed of iron and nickel.

In order to measure electric currents with an excellent precision, it is necessary to limit crosstalk as much as possible, i.e. the influence of external magnetic fields not related to the current to be measured flowing through the current line 2. To do this, it is necessary to precisely control the position of the magnetic parts 30, 40 with respect to the turns of the first and second coils 10, 20. It is possible to position the turns on the printed circuit industrially in a mass-manufacturing process with a precision of +/−50 microns. Likewise, the very fine industrial control of the planarity of the printed circuit guarantees the area of each turn is finely controlled. One problem to be solved is that of positioning with precision and reproducibly the first and second magnetic parts 30, 40 with respect to the turns of the first and second coils 10, 20 and, therefore, with respect to the first printed circuit 50. To do this, the first printed circuit 50 includes a first positioning means 58, which is placed in proximity to the third side 55, and a second positioning means 59 which is placed in proximity to the fourth side 56. The first magnetic part 30 includes a first holding means 31, the second magnetic part 40 includes a second holding means 41. The first positioning means 58 is arranged to join together with the first holding means 31 in order to hold the first reference face 32 at a precise and predetermined distance with respect to the third side 55. The second positioning means 59 is arranged to join together with the second holding means 41 in order to hold the second reference face 42 at a precise and predetermined distance with respect to the fourth side 56. In this way, by controlling on the one hand the precise position of the magnetic parts with respect to the third and fourth sides 55, 56, and on the other hand, by controlling with a high precision the position of the turns of the first and second coils on the printed circuit and most particularly with respect to the third and fourth sides, the turns of the first and second coils are positioned with respect to the magnetic parts with a high precision and in a way that may be reproduced industrially, with the same precision, in a mass-manufacturing process.

Figure 2:
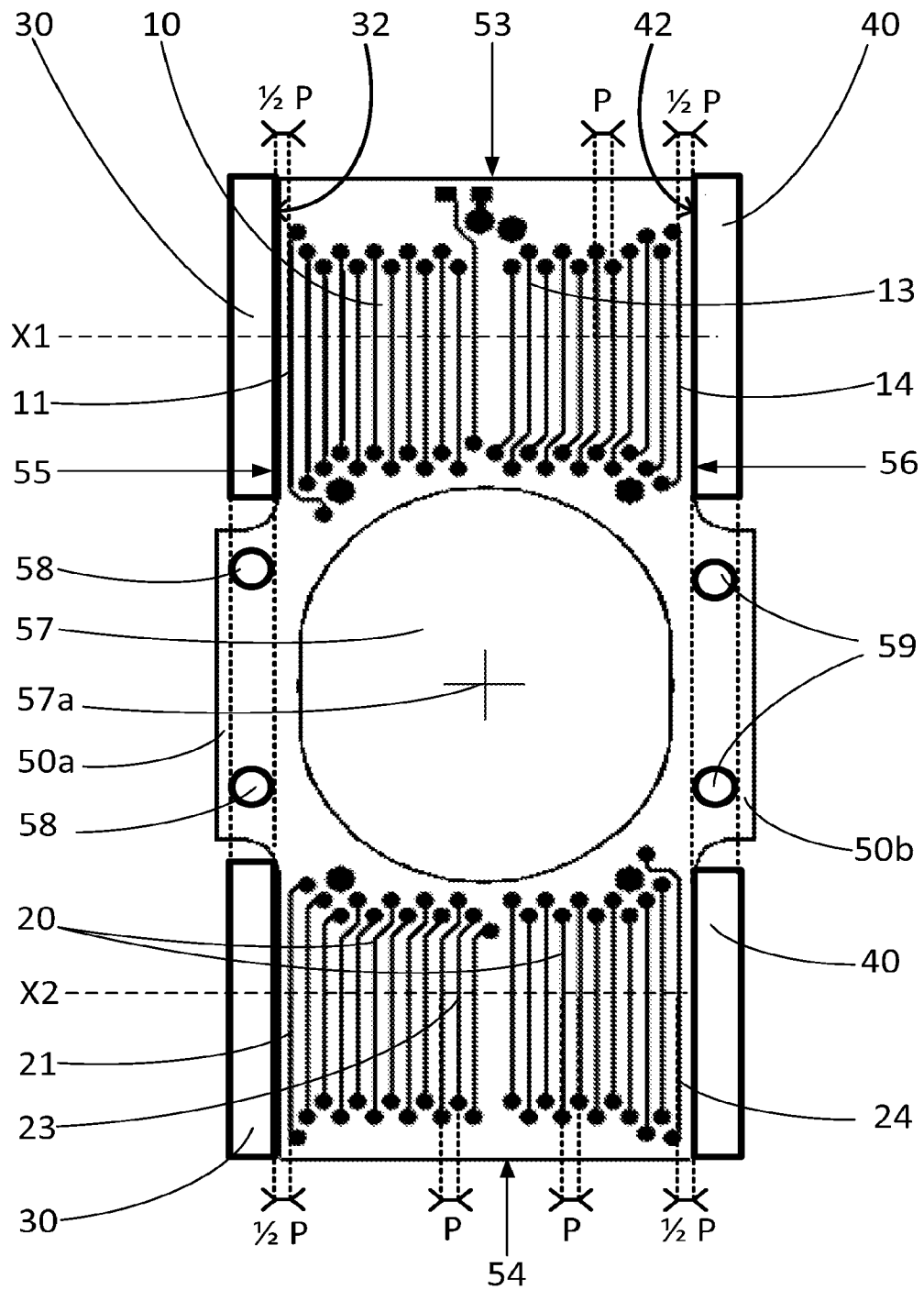
FIG. 2 shows the current transformer 1 seen from the side of a first lower face of a first printed circuit used to produce the coils of the current transformer and to hold with precision magnetic parts.

Preferably, the first positioning means 58 and the second positioning means 59 are at least one hole drilled in the first printed circuit 50, the first holding means 31 is at least one peg dimensioned and arranged to be inserted into the first positioning means 58, and the second holding means 41 is at least one peg dimensioned and arranged to be inserted into the second positioning means 59. Preferably, the first holding means 31 is at least one peg of square cross section the dimension of the side of which is slightly smaller than or equal to the diameter of the hole corresponding to the first positioning means 58. Thus, the peg is press-fitted into the positioning hole and centres naturally in the positioning hole 58. The end of the peg is preferably bevelled in order to accentuate the effect of centring the peg corresponding to the first holding means 31 in the hole corresponding to the first positioning means 58. As a variant, barbs are formed on the surface of the holding means 31, 41 in order to securely fasten the magnetic parts 30, 40 to the first printed circuit 50. The second holding means 41 and the second positioning means 59 are identical to the first holding means 31 and to the first positioning means 58, respectively. Preferably, a plurality of pegs form each first positioning means 31 or each second positioning means 41 and a plurality of positioning holes form each first positioning means 58 and each second positioning means 59 as shown in FIG. 1. Other solutions such as conical pegs may be employed provided that the holding means interacts without slack with the positioning means. FIG. 2 shows the current transformer 1 seen from the side of the first lower face 52 of the first printed circuit 50. Preferably, the first magnetic part 30 and the second magnetic part 40 are produced by means of parallelepipedal sheets made of magnetic metal material. The first and second holding means 31, 41 are preferably cut in the first magnetic part 30 and in the second magnetic part 40, respectively, by flatbed cutting or punching. The first printed circuit 50 includes a first protuberance 50a formed in the third side 55 of the first printed circuit 50 and includes a second protuberance 50b formed in the fourth side 56 of said first printed circuit 50. Preferably, at least one hole corresponding to the first positioning means 58 is formed in the first protuberance 50a and at least one hole corresponding to the second positioning means 59 is formed in the second protuberance 50b. In this way, the first positioning means 58 and the second positioning means 59 are positioned on the axis of the first and second magnetic parts, this simplifying assembly, decreasing the number of parts and increasing the compactness of the current transformer 1.

As a variant (not shown) the first printed circuit 50 may be formed from two independent printed half-circuits, a first printed half-circuit for forming the first coil 10, and a second printed half-circuit for forming the second coil 20, the two printed half-circuits being held and positioned by the first and second holding means of the magnetic parts 31, 41.

The first coil 10 and the second coil 20 are formed from turns produced in the thickness of the first printed circuit 50, said turns being coiled with a constant coil pitch P, as shown in FIG. 2. Preferably, the coil pitch P is comprised between 50 and 700 microns. In addition, in order to decrease the influence of the perturbations caused by external magnetic fields, the first reference face 32 and the second reference face 42 are located a distance larger than the coil pitch P away from the first upper face 51 and the first lower face 52 of the first printed circuit 50. The first printed circuit 50 is thus flanked by the first magnetic part 30 and the second magnetic part 40 on the third and fourth sides 55, 56.

Figure 3:
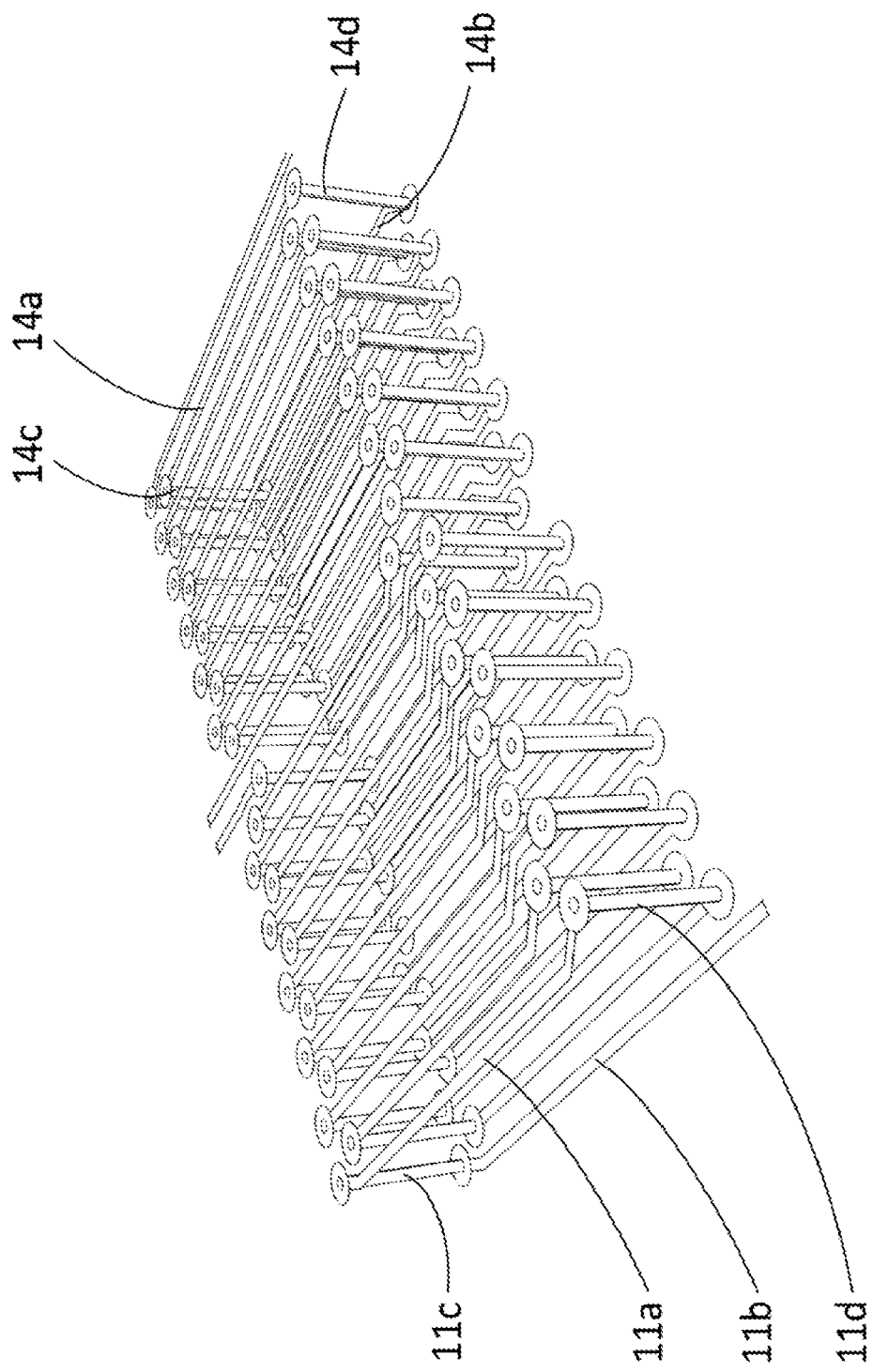
FIG. 3 is a perspective view of a coil composed of turns formed in the thickness of the printed circuit.
Figure 4:
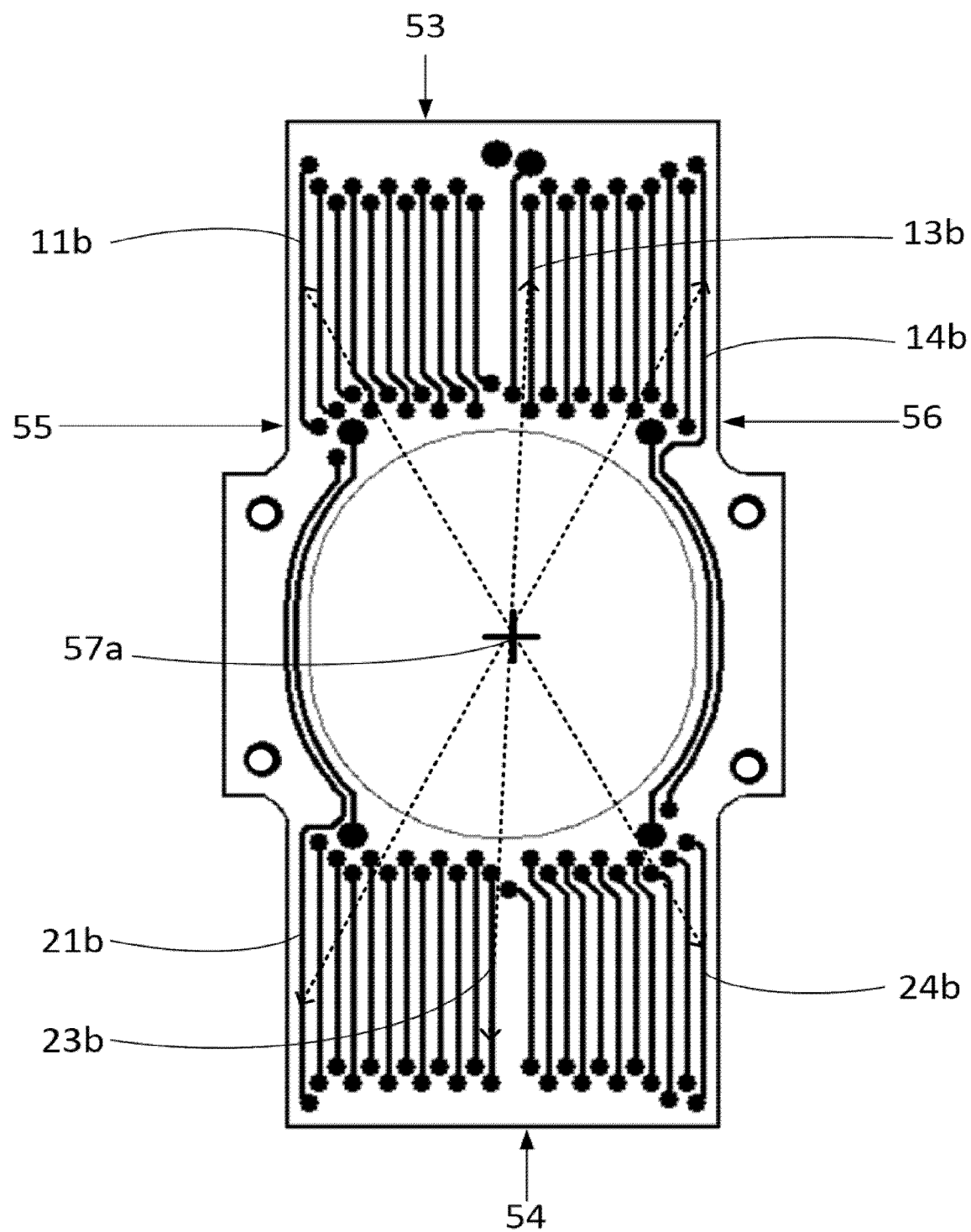
FIG. 4 is a view of one face of a printed circuit in order to show the arrangement of segments of turns of the coils of the current transformer.

Each turn of each coil is made up of a first conductive segment on the first upper face 51 of the first printed circuit 50 and of a second conductive segment on the first lower face 52 of said first printed circuit 50, as shown in FIG. 3. The ends of the first segments are connected to the ends of the second segments by conductive vias, in a way that is known per se. For example, a first lateral turn 11 of the first coil 10 is made up of a first segment 11a on the first upper face 51, said first segment being connected to a second segment 11b on the first lower face 52 by means of a first via 11c. A second via 11d connects the first turn 11 to a following turn. The first coil 10 also includes a second lateral turn 14 composed of first and second segments 14a, 14b and of first and second vias 14c, 14d. In order to decrease the influence of perturbing external magnetic fields, the first conductive segments of the turns of the first coil 10 are symmetric, with respect to the centre 57a of the first aperture 57, with the first conductive segments of the turns of the second coil 20, and the second conductive segments of the turns of the first coil 10 are symmetric, with respect to the centre 57a of the first aperture 57, with the second conductive segments of the turns of the second coil 20, as shown in FIG. 4. A first segment 13b of any given turn 13 of the first coil 10 possesses a symmetric 23b with respect to the centre 57a.

As shown in FIG. 2, the first lateral turn 11 of the first coil 10 is placed at a first end of the first coil 10 facing the first reference face 32 of the first magnetic part 30, and the second lateral turn 14 is placed at a second end of the first coil 10 facing the second reference face 42 of the second magnetic part 40. In the same way, the second coil 20 includes a third lateral turn 21 at a third end facing the first reference face 32, and a fourth lateral turn 24 at a fourth end facing the second reference face 42. Advantageously, the first coil 10 and the second coil 20 are placed on the first printed circuit 50 in such a way that:

the distance between the first lateral turn 11 of the first coil 10 and the first reference face 32 is substantially equal to half the coil pitch P, i.e. to P/2, the distance between the first lateral turn 21 of the second coil 20 and the first reference face 32 is substantially equal to half the coil pitch P, the distance between the second lateral turn 14 of the first coil 10 and the second reference face 42 is substantially equal to half the coil pitch P, and the distance between the second lateral turn 24 of the second coil 20 and the second reference face 42 is substantially equal to half the coil pitch P.

In this way, the magnetic parts having an excellent magnetic permeability and behaving as magnetic shunts with respect to the first coil 10 and the second coil 20, the distance between the first lateral turn 11 of the first coil 10 and the first lateral turn 21 of the second coil 20 is equal to two times half the coil pitch P, i.e. to the coil pitch P. The same goes for the distance between the second lateral turn 14 of the first coil 10 and the second lateral turn 24 of the second coil 20. Thus, the first coil 10 and the second coil 20 virtually form an uninterrupted set of turns, equivalent to a single coil, coiled with a constant coil pitch equal to P. It is very important, if the coil pitch is to be guaranteed to be rigorously constant for all the turns formed by the first coil 10 and the second coil 20, for the first reference face 32 to be positioned with precision at a predetermined distance away from the third side 55 and therefore at a precise distance away from the first lateral turn 11. The same positioning constraint applies to all the lateral turns of the coils of the current transformer 1. In order to scrupulously apply said positioning constraint, and on account of the need to form a connection pad between each segment end and the via to which the end is connected, at least one of the first segments 11a or 14a or at least one of the second segments 11b or 14b of the first lateral turn 11 of the first coil 10 is curved into a "C" shape the ends of which extend away from the first reference face 32 and from the second reference face 42, respectively. Said vias are therefore placed at a distance larger than one half of the coil pitch P from the reference faces 32, 42. The first segment 11 a shown in FIG. 3 illustrates this particular arrangement. This arrangement is reproduced in at least one of the first or second segments 21a, 21b of the first lateral turn 21 of the second coil 20 or one of the first or second segments 24a, 24b of the second lateral turn 24 of the second coil 20.

Figure 5:
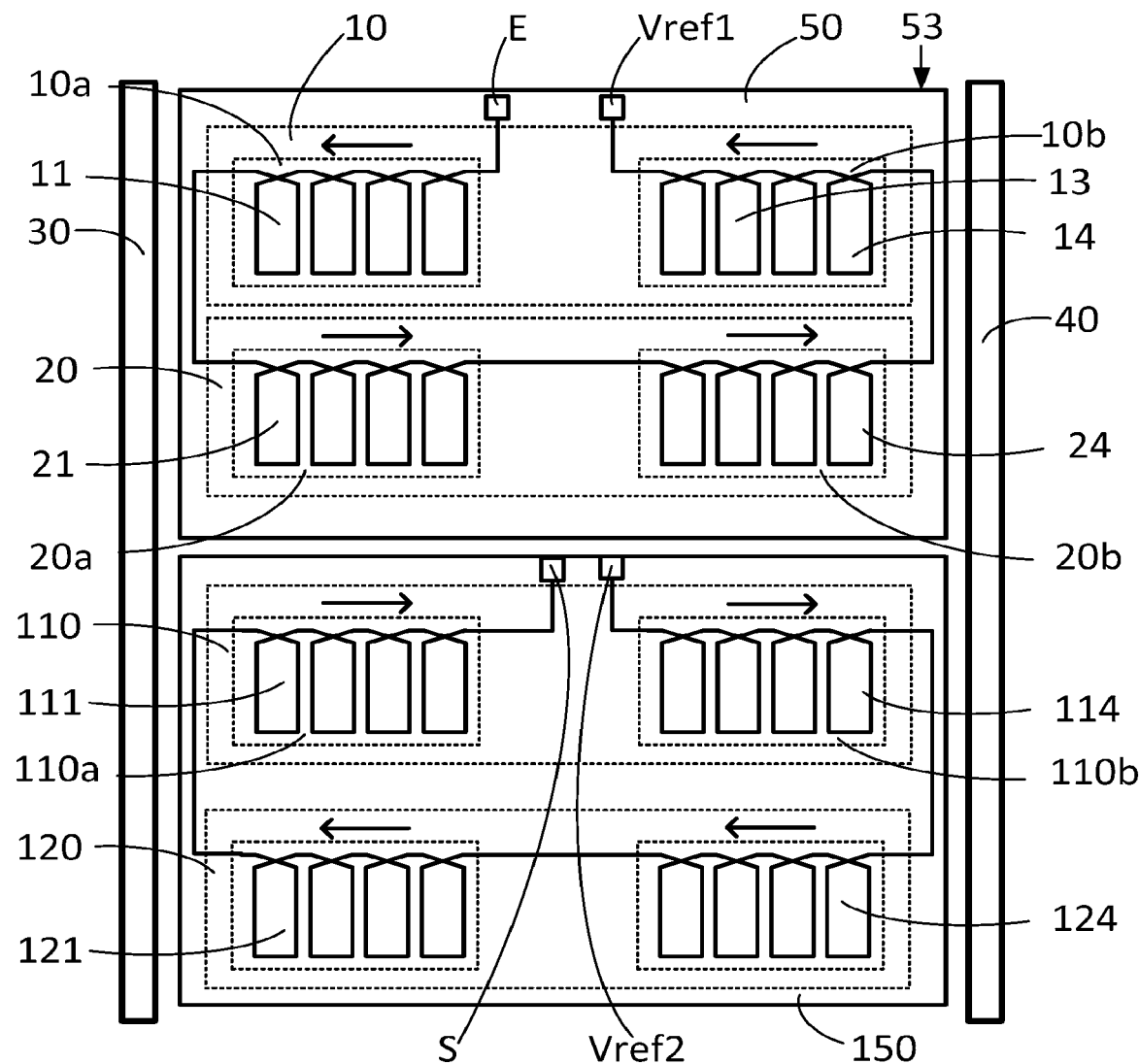
FIG. 5 is a wiring diagram of the coils of the current transformer.

The first and second coils 10, 20 are intended to deliver a signal representative of an electric current to be measured in the current line 2. To do this, as shown in FIG. 5, the first coil 10 and the second coil 20 are electrically connected in series in the following way:

the first lateral turn 11 of the first coil 10 is connected to the first lateral turn 21 of the second coil 20, and the second lateral turn 14 of the first coil is connected to the second lateral turn 24 of the second coil.

In addition, the first coil 10 is composed of:

a first half-coil 10a comprising a first electric connection point E, and a second half-coil 10b comprising a second electric connection point Vref1, the first and second connection points being located substantially in the middle of the first side 53. A measurement of the electric signal between the first connection point E and the second connection point Vref1 delivers a measurement of the electric current flowing through the current line 2. In order to make the first coil 10 and the second coil 20 perfectly symmetric with respect to the centre 57a of the first aperture 57, the second coil is also composed of two half-coils 20a, 20b that are connected in series.

Figure 6:
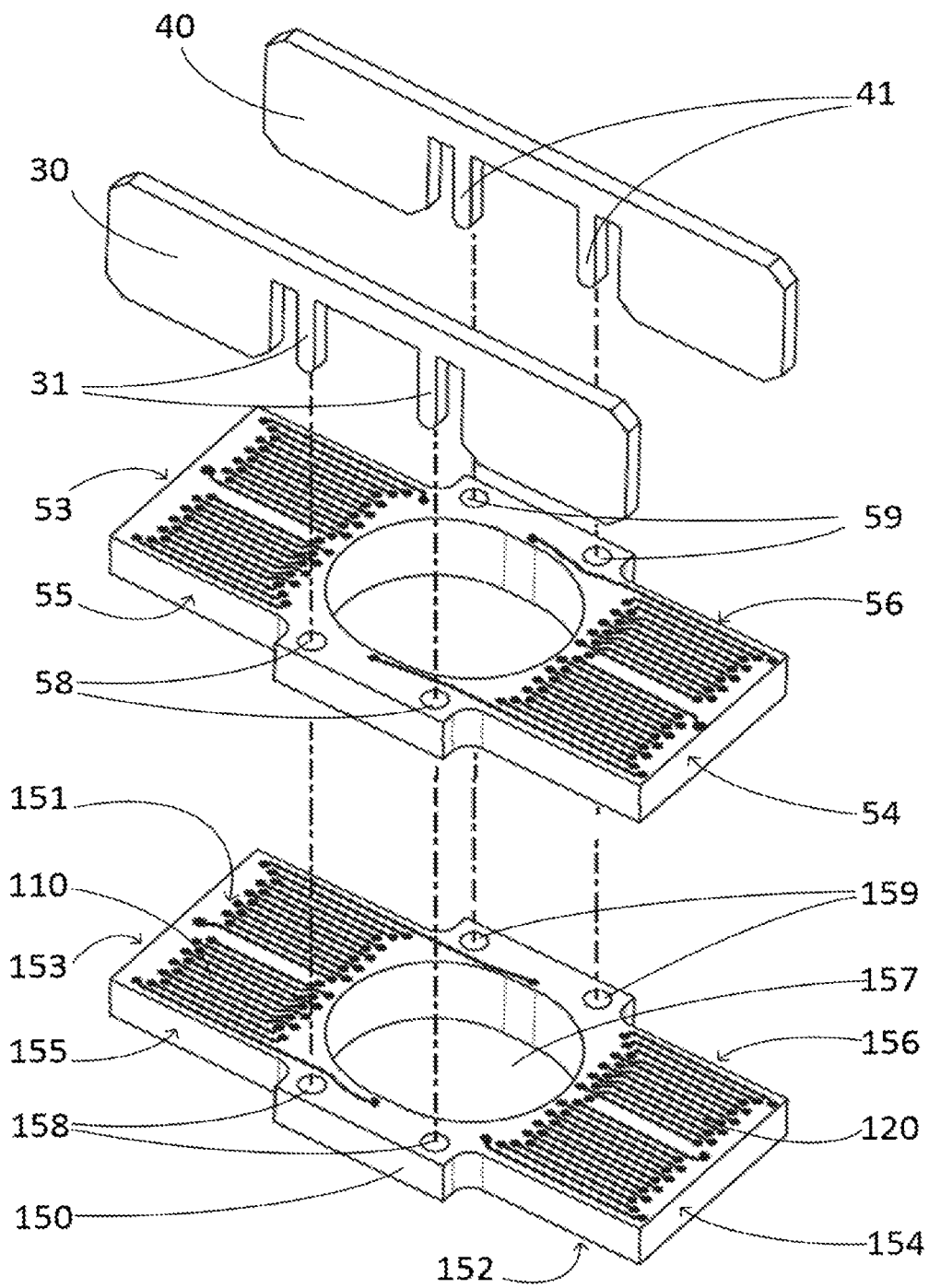
FIG. 6 is an exploded view of a second embodiment of the current transformer according to the invention.

The current transformer 1 thus described allows current to be measured with a high precision. In order to increase the electric signal level and further improve the immunity to external magnetic fields, a second embodiment is shown in FIG. 6. The current transformer 1 includes a third coil 110 and a fourth coil 120 that are produced by means of a second printed circuit 150 of substantially parallelepipedal shape, including a second upper face 151, a second lower face 152, a fifth side 153, a sixth side 154, the sixth side 154 being opposite to the fifth side 153, a seventh side 155 and an eighth side 156, the eighth side 156 being opposite to the seventh side 155. The third coil 110 and the fourth coil 120 are coiled about axes that are parallel to the first and second coil axes X1, X2, respectively. The second printed circuit 150 includes a second aperture 157 in the two second faces 151, 152 in order to form a through-passage for the current line 2, the third coil 110 and the fourth coil 120 being placed on either side of the second aperture 157. To precisely control the position of the magnetic parts 30, 40 with respect to the turns of the third and fourth coils 110, 120, the second printed circuit 150 includes, at least:

a third positioning means 158 arranged to join together with the first holding means 31 in order to hold with precision the first reference face 32 a predetermined distance away from the seventh side 155, and a fourth positioning means 159 arranged to join together with the second holding means 41 in order to hold with precision the second reference face 42 a predetermined distance away from the eighth side 156.

Thus, analogously to the way in which the first and second coils 10, 20 are positioned, by controlling the position of the magnetic parts 30 and 40 with respect to the seventh and eighth sides, 155, 156, and the turns of the third and fourth coils being positioned with high precision on the printed circuit, and most particularly with respect to the seventh and eighth sides 155, 156, the turns of the third and fourth coils are positioned with a high precision with respect to the magnetic parts 30, 40. The first printed circuit 50 and the second printed circuit 150 are preferably adhesively bonded to each other.

The third coil 110 and the fourth coil 120 are formed of turns produced in the thickness of the second printed circuit 150, similarly to the first coil 10 and to the second coil 20, which are formed of turns produced in the thickness of the first printed circuit 50. To increase immunity to external magnetic fields, the third coil 110 is coiled in the opposite direction to the coiling direction of the first coil 10, and the fourth coil 120 is coiled in the opposite direction to the coiling direction of the second coil 20. The coiling direction is represented by an arrow located above each of the various coils in FIG. 5. Equivalently to the first embodiment, the first reference face 32 and the second reference face 42 are located a distance larger than the coil pitch P away from the first upper face 51 of the first printed circuit 50 and the second lower face 152 of the second printed circuit 150. The first printed circuit 50 and the second printed circuit 150 are thus flanked by the first magnetic part 30 and the second magnetic part 40.

Similarly to the first coil 10 and to the second coil 20, the third coil 110 includes:

a third half-coil 110a comprising a third electrical connection point S, and a fourth half-coil 110b comprising a fourth electric connection point Vref2, the third electric connection point S and the fourth electric connection point Vref2 being located substantially in the middle of the fifth side 153.

In order to make the third coil 110 and the fourth coil 120 perfectly symmetric with respect to the centre of the second aperture 157, said fourth coil 120 is also composed of two half-coils 120a, 120b that are connected in series. The current transformer 1 thus formed is able to deliver:

a first measurement signal M1 representative of the current flowing through the current line 2 passing through the first aperture 57, and a second measurement signal M2 representative of the current flowing through the current line 2 passing through the second aperture 157 of the current measurement device 1.

The first measurement signal M1 is the signal present between the first electric connection point E and the second electric connection point Vref1. The second measurement signal M2 is the signal present between the third electric connection point S, and the fourth electric connection point Vref2. The measurement M is issued from a measurement of the first measurement signal M1 and of the second measurement signal M2. Preferably, the connection points Vref1 and Vref2 are connected to the same reference potential and the measurement M is the result of a measurement of the voltage differential, with respect to said reference potential, between the first electric connection point E and the third electric connection point S. The measurement M thus corresponds to the measurement of the first signal M1 added to the measurement of the second signal M2.

More generally, in order to increase the electric signal level, the current transformer 1 may include as many coils 10, 20, 110, 120 is necessary, formed in as many printed circuits 50, 150 as necessary provided that the printed circuits include positioning means arranged to join together with the holding means for holding with precision the reference faces of the magnetic parts at a predetermined distance away from the sides of the printed circuits.

With the aim of decreasing the influence of perturbations caused by external electromagnetic fields on the connections between the current transformer 1 and the circuits for measuring the signals delivered to the connection points E, S, Vref1 and Vref2, the first printed circuit 50 or the second printed circuit 150 includes a third protuberance 50c, preferably formed in the first or second side 53, 54, for the placement of:

measurement circuits for processing the signals delivered by the first, second, third and fourth coils 10, 20, 110, 120 and delivering a measurement signal M representative of the current flowing through the current line 2, electrical connections for transmitting the measurement signal to a measurement unit 5.

In this way, the length of the connections between the current transformer 1 and the measurement circuits is minimized, therefore minimizing the influence of external perturbations.

The technical features described above make it possible to produce a current transformer 1 that delivers an extremely precise measurement signal M without requiring adjustment or calibration, while benefiting from a high immunity to external electromagnetic perturbations: a level of crosstalk better than 0.2% is achievable. The use of printed-circuit technology allowing highly precise production and industrial mass manufacture associated with a simple and clever design with respect to assembly of the magnetic parts with the printed circuits allows a high-performance product to be obtained at a low cost price. In addition, since the current transformer 1 is extremely compact, said transformer may be incorporated into an electric installation in which the current lines 2 are very close together. The current transformer according to the invention may also be used in a unit for protecting or controlling electric distribution circuits such as a circuit breaker or a contactor.

Figure 7:
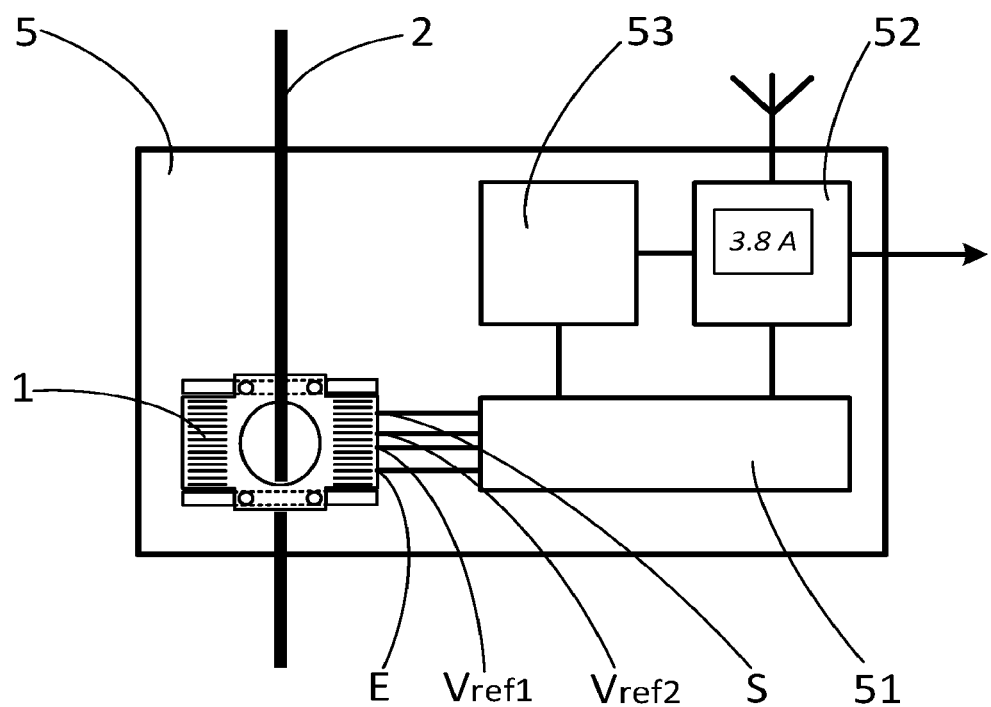
FIG. 7 illustrates, in the form of a block diagram, various functional modules of a current measurement unit including a current transformer according to the invention.
Figure 8:
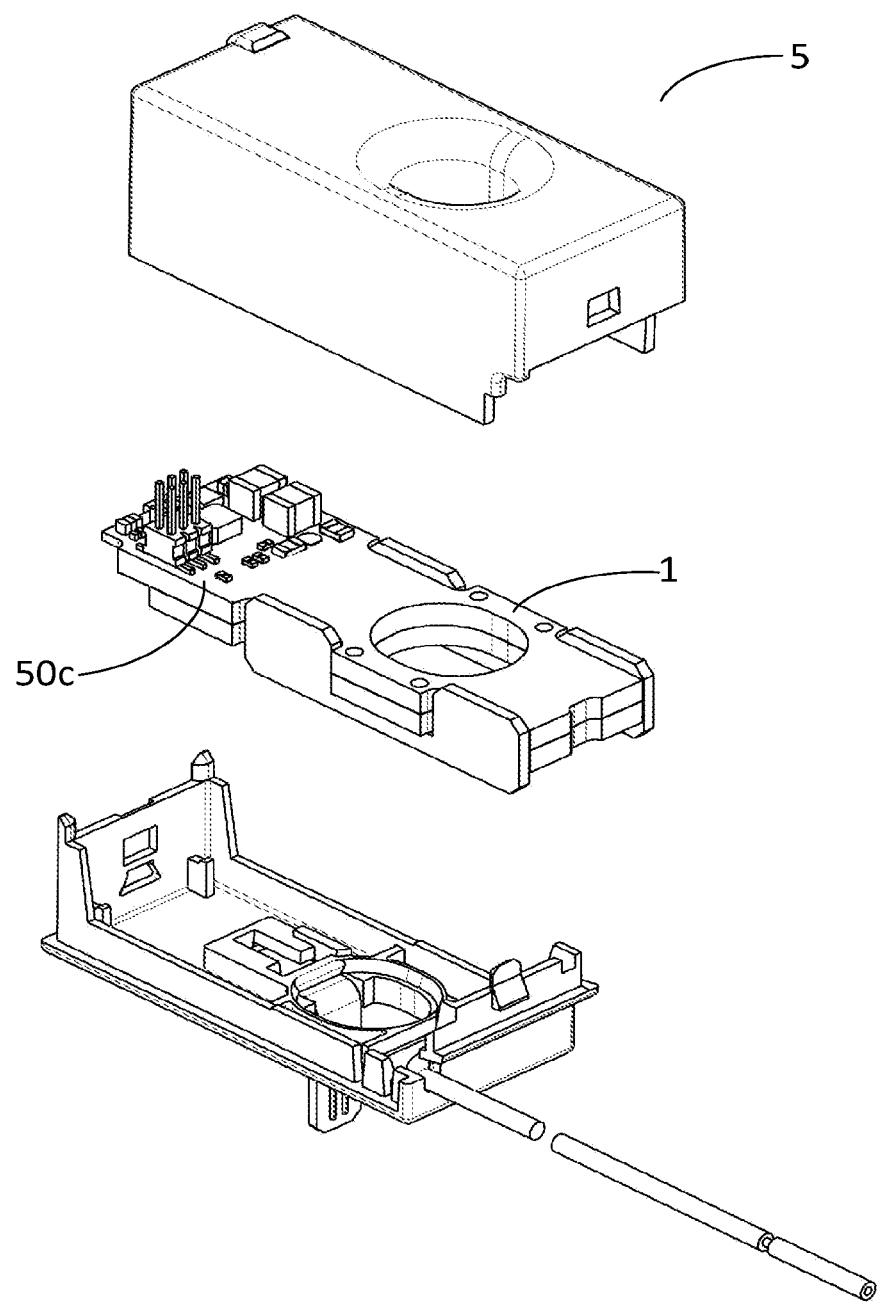
FIG. 8 is an exploded view of the current measurement unit.

The invention also relates to a unit 5 for measuring the current flowing through a current line 2 of an electric installation and including a current transformer according to the invention. Such a measurement unit is shown, in FIG. 7, in the form of a block diagram and in FIG. 8 in the form of an exploded view. Said measurement unit 5 includes:

- a measurement circuit 51 for delivering a measurement M of the amplitude of the current flowing through the current line 2,
- an interface circuit 52 connected to the measurement circuit 51 in order to display locally the measurement M of the measurement signal or to transmit the value of said measurement M, via a radio means, for example of NFC, Bluetooth, ZigBee or RFID type, or via a wired communication,
- a supply circuit 53 for supplying the measurement circuit and the interface circuit 52 with power, and
- a current transformer 1 such as described above, including a first aperture 57 and a second aperture 157 through which the current line 2 passes, said current transformer 1 being connected to the measurement circuit 51 in order to deliver to said measurement circuit 51:
- a first measurement signal M1 representative of the current flowing through the current line 2 passing through the first aperture 57, and
- a second measurement signal M2 representative of the current flowing through the current line 2 passing through the second aperture 157 of the current measurement device 1.

Such a measurement unit 5 is very precise, very insensitive to external perturbations and not very voluminous. It is particularly intended to measure current, power or energy in an electric installation.

The invention claimed is:

1. A current transformer comprising:
a first coil and a second coil, which are produced with a first printed circuit of substantially parallelepipedal shape, including a first upper face, a first lower face, a first side, a second side, the second side being opposite to the first side, a third side and a fourth side, the fourth side being opposite to the third side, the first coil being formed from first turns coiled about a first coil axis that is substantially perpendicular to the third and fourth sides, the second coil being formed from second turns coiled about a second coil axis that is substantially perpendicular to the third and fourth sides, the first printed circuit including a first aperture in the first upper and lower faces in order to form a through-passage for a current line, said current line forming a primary circuit of the current transformer, the first coil and the second coil being placed on either side of the first aperture and forming a secondary circuit, and a first magnetic part of elongate shape including a first reference face and at least one second magnetic part of elongate shape including a second reference face, wherein the current transformer comprises:
the first printed circuit including a first positioning means, placed in proximity to the third side, and a second positioning means placed in proximity to the fourth side,
the first magnetic part comprising a first holding means,
the second magnetic part comprising a second holding means,
the first positioning means is arranged to join together with the first holding means in order to hold the first reference face at a predetermined distance with respect to the third side, and the second positioning means is arranged to join together with the second holding means in order to hold the second reference face at a predetermined distance with respect to the fourth side.

2. The current transformer according to claim 1, wherein:
the first positioning means and the second positioning means are holes drilled in the first printed circuit,
the first holding means is a peg arranged to be inserted into the first positioning means, and
the second holding means is a peg arranged to be inserted into the second positioning means.

3. The current transformer according to claim 2, wherein:
the first positioning means is placed in a first protuberance formed in the third side of the first printed circuit,
the second positioning means is placed in a second protuberance formed in the fourth side of the first printed circuit,
the first holding means is formed by a cutout of the first magnetic part, and
the second holding means is formed by a cutout of the second magnetic part.

4. The current transformer according to claim 1, wherein the first coil and the second coil are formed of turns coiled with a constant coil pitch.

5. The current transformer according to claim 4, wherein the coil pitch is comprised between 50 and 700 microns.

6. The current transformer according to claim 4, wherein the first reference face and the second reference face protrude from the first upper face and the first lower face by a distance larger than the coil pitch.

7. The current transformer according to claim 4, wherein each turn being produced in the thickness of the first printed circuit and including a first conductive segment on the first upper face of the first printed circuit and a second conductive segment on the first lower face of the first printed circuit, the first conductive segments of the turns of the first coil are symmetric, with respect to the centre of the first aperture, with the first conductive segments of the turns of the second coil and the second conductive segments of the turns of the first coil are symmetric, with respect to the centre of the first aperture, with the second conductive segments of the turns of the second coil.

8. The current transformer according to claim 4, wherein, the first coil comprising a first lateral turn at a first end facing the first reference face, and a second lateral turn at a second end facing the second reference face, and the second coil including a third lateral turn at a third end facing the first reference face, and a fourth lateral turn at a fourth end facing the second reference face, the first coil and the second coil are placed on the first printed circuit in such a way that:
the distance between the first lateral turn of the first coil and the first reference face is substantially equal to half the coil pitch, the distance between the first lateral turn of the second coil and the first reference face is substantially equal to half the coil pitch, the distance between the second lateral turn of the first coil and the second reference face is substantially equal to half the coil pitch, and the distance between the second lateral turn of the second coil and the second reference face is substantially equal to half the coil pitch.

9. The current transformer according to claim 8, wherein the ends of at least one of the first or second segments of the first lateral turn and of the second lateral turn of the first coil and of the second coil, respectively, are curved to form a C the ends of which extend away from the first reference face and from the second reference face, respectively.

10. The current transformer according to claim 8, wherein the first and second coil are electrically connected in series, the first lateral turn of the first coil being connected to the first lateral turn of the second coil and the second lateral turn of the first coil being connected to the second lateral turn of the second coil.

11. The current transformer according to claim 10, wherein the first coil is composed of:
    a first half-coil comprising a first electric connection point, and
    a second half-coil comprising a second electric connection point,
    the first and second connection points being located substantially in the middle of the first side.

12. The current transformer according to claim 1, further comprising a third coil and a fourth coil that are produced with a second printed circuit of substantially parallelepipedal shape, including a second upper face, a second lower face, a fifth side, a sixth side, the sixth side being opposite to the fifth side, a seventh side and an eighth side, the eighth side being opposite to the seventh side, the third and fourth coils being coiled about axes parallel to the first and second coil axes, respectively, the second printed circuit comprising a second aperture in the two second faces in order to form a through-passage for the electrical conductor, the third coil and the fourth coil being placed on either side of the second aperture.

13. The current transformer according to claim 12, wherein the second printed circuit comprises:
    a third positioning means arranged to join together with the first holding means in order to hold the first reference face a predetermined distance away from the seventh side, and
    a fourth positioning means arranged to join together with the second holding means in order to hold the second reference face a predetermined distance away from the eighth side.

14. The current transformer according to claim 12, wherein, the third coil and the fourth coil being formed from turns produced in the thickness of the second printed circuit:
    the third coil is coiled in the opposite direction to the coiling direction of the first coil, and
    the fourth coil is coiled in the opposite direction to the coiling direction of the second coil.

15. The current transformer according to claim 12, wherein the third coil comprises:
    a third half-coil comprising a third electric connection point, and
    a fourth half-coil comprising a fourth electric connection point,
    the third electric connection point and the fourth electric connection point being located substantially in the middle of the fifth side.

16. The current transformer according to claim 12, wherein the first printed circuit or the second printed circuit comprises a third protuberance for the placement of:
    measurement circuits for processing signals delivered by the first, second, third and fourth coils and delivering a measurement signal representative of a current flowing through said current line,
    electric connections for transmitting the measurement signal to a measurement unit.

17. A unit for measuring a current flowing through said current line of an electric installation, said unit comprising:
    the current transformer according to claim 1, the current transformer further including a second aperture said current line passing through the first and second apertures passes, the current transformer delivering:
    a first measurement signal representative of said current flowing through the current line passing through the first aperture, and
    a second measurement signal representative of the current flowing through said current line passing through the second aperture of the current transformer, and
    a measurement circuit, connected to the current transformer in order to receive the first measurement signal and the second measurement signal, said measurement circuit delivering a measurement of an amplitude of said current flowing through the current line, said measurement being issued from a measurement of the first measurement signal and of the second measurement signal,
    an interface circuit connected to said measurement circuit in order to display said measurement of the first measurement signal, the second measurement signal, or transmit said measurement, and
    a supply circuit for supplying said measurement circuit and the interface circuit with power.

\* \* \* \* \*